United States Patent [19]
Park et al.

[11] Patent Number: 5,332,685
[45] Date of Patent: Jul. 26, 1994

[54] METHOD OF MANUFACTURING A DRAM CELL

[75] Inventors: Young J. Park; Seok H. Lee, both of Seoul, Rep. of Korea

[73] Assignee: Hyundai Electronics Industries Co., Ltd., Rep. of Korea

[21] Appl. No.: 82,276

[22] Filed: Jun. 24, 1993

[30] Foreign Application Priority Data

Jun. 24, 1992 [KR] Rep. of Korea .................... 92-10994

[51] Int. Cl.$^5$ ............................................ H01L 21/70
[52] U.S. Cl. ........................................ 437/52; 437/47; 437/60; 437/919
[58] Field of Search ................... 437/47, 48, 52, 60, 437/919; 257/306

[56] References Cited

U.S. PATENT DOCUMENTS 5,219,780 6/1993 Jun .......................................... 437/52
5,229,314 7/1993 Okudaira et al. ...................... 437/52

*Primary Examiner*—Tom Thomas
*Attorney, Agent, or Firm*—Merchant, Gould, Smith, Edell, Welter & Schmidt

[57] ABSTRACT

Disclosed is a novel DRAM manufacturing method to reduce difficulties due to the high aspect ratio of contact hole for storage electrode. The method comprises the steps of formation of a contact plug on contact areas of bit line and storage electrode at the same time and then, formation of a bit line that is in contact with the contact plug for bit line and finally, making a storage electrode that is as high as the bit line contact with the contact plug for storage electrode.

8 Claims, 3 Drawing Sheets

METHOD OF MANUFACTURING A DRAM CELL

FIELD OF THE INVENTION

This invention relates to a DRAM (Dynamic Random Access Memory) cell of a highly integrated semiconductor device, and more particularly to a DRAM manufacturing method comprising the steps of forming a contact plug on contact areas of bit line and storage electrode at the same time and then, forming a bit line that is in contact with the contact plug for bit line and finally, contacting a storage electrode that is as high as and insulated from the bit line to the contact plug for storage electrode.

INFORMATION DISCLOSURE STATEMENT

Generally, in the manufacturing of a DRAM cell of a highly integrated semiconductor device, making a storage electrode contact with a silicon substrate is a difficult process because of the high aspect ratio of a contact hole for storage electrode.

FIG. 1 is a cross-sectional view of a typical DRAM cell illustrating a bit line 30 and storage electrode 38 that have been contacted to a silicon substrate 1, respectively, using the conventional manufacturing technique. As shown in the figure, a field oxide layer 3 and a word line 5 having an oxide layer spacer 6 on its side wall are formed on the semiconductor substrate 1 and a first insulating layer 31 is formed on the entire substrate including the word line 5. Then, a selected portion of the first insulating layer 31 is etched to form a contact hole 35 fox bit line and a bit line 30 is formed by filling the contact hole with a conductive material. Next, a silicide pattern 32, and oxide layer pattern 34 are formed on the bit line 35 and then, a second insulating layer 36 is formed on the device. Finally, a contact hole 37 for storage electrode is formed by etching selected portions of the second insulating layer and the first insulating layer using a contact mask of storage electrode and then, a storage electrode 38 is formed.

In the above-mentioned conventional manufacturing method, the first insulating layer 31 and second insulating layer 36 must be etched in order to make the storage electrode 38 contact with the silicon substrate 1. However, the etching process is difficult to carry out because the aspect ratio of the contact hole 37 for storage electrode is high. Moreover, due to a high topological difference encountered during the patterning process of the storage electrode after filling up the contact hole 37 completely with the conducting layer for storage electrode, etching the unnecessary conducting layer for storage electrode in other parts becomes a difficult process.

SUMMARY OF THE INVENTION

The present invention is directed to a method of manufacturing a DRAM cell in which contact plugs on the contact areas of a bit line and a storage electrode are formed at the same time and then, the bit line and storage electrode contact with the contact plug, respectively, in order to reduce difficulties caused by the high aspect ratio of contact hole for storage electrode.

Also, in order to solve problems in later processes caused by the high topological difference, the present invention forms the storage electrode along the side wall of bit line to manufacture a DRAM cell having the storage electrode that is less high.

The DRAM cell manufacturing method of the present invention is comprised of the following manufacturing steps:

a step of forming a word line having an oxide layer spacer on its side wall, on a silicon substrate;

a step of forming a first insulating layer on the entire silicon substrate;

a step of forming several contact holes by etching away some portions of first insulating layer using contact masks fox bit line and storage electrode;

a step of forming a contact plug by filling the contact holes with a conductive material;

a step of depositing a conducting layer fox bit line and a second insulating layer on the substrate including said first insulating layer and contact plug, and forming a second insulating layer pattern and bit line pattern on the contact plug for bit line by the etching process using a bit line mask;

a step of forming an insulating layer spacer on the side walls of the bit line pattern and the second insulating layer pattern;

a step of forming a third insulating layer thickly over the entire substrate and etching back until the underlying second insulating layer is exposed;

a step of forming a photoresist layer pattern for storage electrode contact mask on the third insulating layer;

a step of isotropically etching the third insulating layer that has been exposed to the contact plug for storage electrode, and removing the photoresist layer pattern for storage electrode contact mask;

a step of depositing a conducting layer for storage electrode over the entire substrate, and coating a photo resistor layer over it;

a step of forming a storage electrode pattern by etching back the photoresist layer and conducting layer for storage electrode until the third insulating layer and second insulating layer are exposed;

a step of removing the remaining photoresist layer and wet etching out third insulating layer to expose the storage electrode; and a step of forming a capacitor dielectric layer and plate electrode on top of the storage electrode.

DETAILED DESCRIPTION OF THE INVENTION

Figure 1:
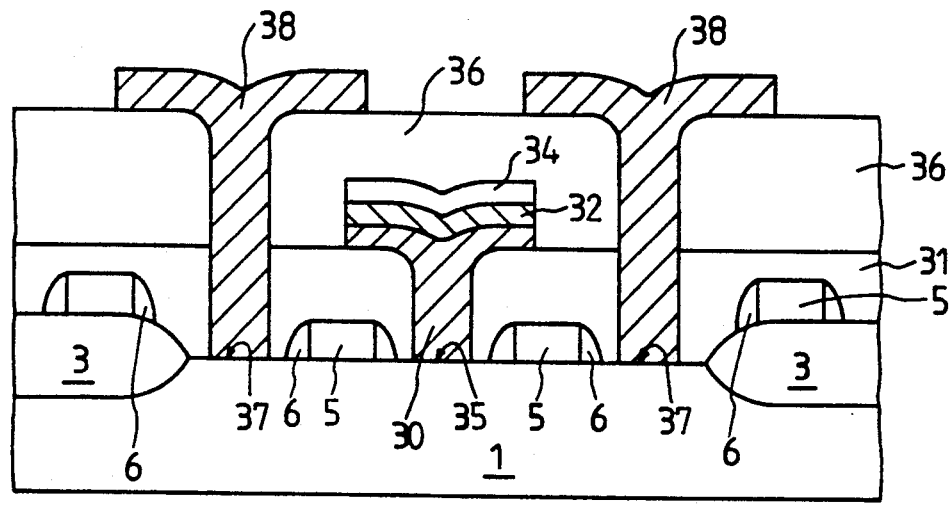
FIG. 1 is a cross-sectional view of a DRAM cell including a bit line and a storage electrode of the prior art.

Now, an embodiment of the present invention will be explained in detail by referring to the drawings attached.

FIGS. 2a through 2e are cross-sectional views illustrating the manufacturing processes according to the present invention.

Figure 2A:
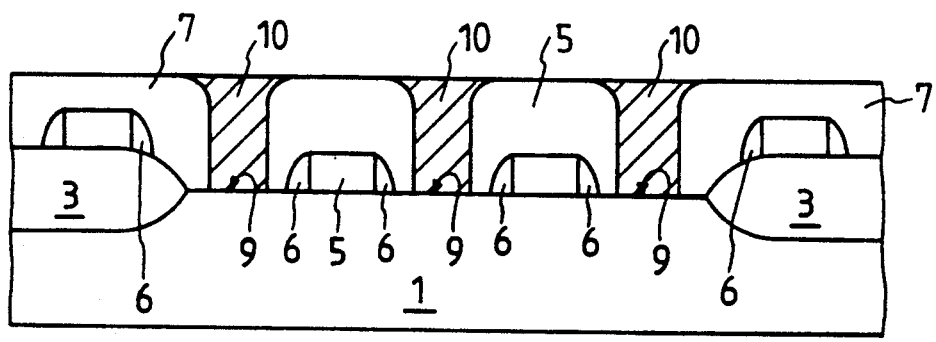
FIG. 2a through 2e are cross-sectional views of a DRAM cell illustrating the manufacturing processes according to the present invention.

FIG. 2a shows a field oxide layer 3, word line 5, and a contact plug 10 formed on a silicon substrate 1. As shown in FIG. 2a, first, the field oxide layer 3 and the word line 5 having an oxide layer spacer 6 on its side wall are formed on the silicon substrate 1 and then, a first insulating layer 7, for example SiO$_2$ layer is formed over the entire substrate. Next, several contact holes 9 are opened by etching away some portions of the first insulating layer 7 using contact masks for the bit line and the storage electrode. Finally, a contact plug 10 is formed by completely filling the contact holes 9 with a conductive material.

Two different types of methods could be used to form the contact plug 10; one is the method of depositing a thick polysilicon layer over the entire substrate and then etching back until the first insulating layer 7 is fully exposed so that the polysilicon layer remains only in the contact holes 9 and the other is the method of selectively depositing a polysilicon layer or metal layer on the contact holes only.

Figure 2B:
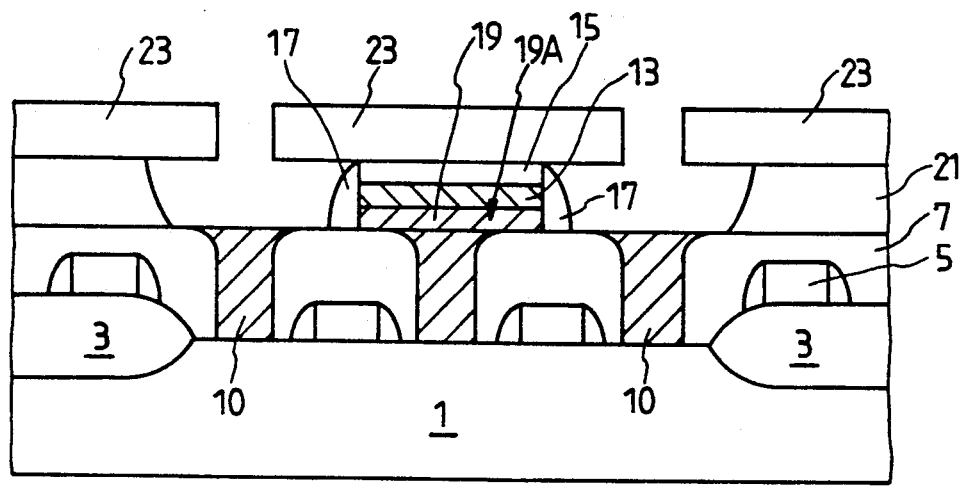

After completing the processes described in FIG. 2a, a conducting layer 19 for bit line (polysilicon layer, for example), silicide layer 13, and a second insulating layer 15 (oxide layer, for example) are formed sequentially over the substrate and then, a bit line 19A, silicide layer 13 pattern and the second insulating 15 pattern are formed on the contact plug 10 for the bit line by the etching process using a bit line mask as shown in FIG. 2b.

Then, an insulating layer spacer 17 (oxide layer, for example) is formed on the side walls of the bit line 19A, silicide layer 13, and the second insulating layer 15. Next, a third insulating layer 21, for example BPSG (Boro Phospho Silicate Glass) layer, is thickly coated over the entire substrate and then, it is etched back until the second insulating layer 15 is exposed. And then, a photoresist layer pattern 23 for storage electrode contact mask is formed and, via an isotropical etching process, the third insulating layer 21 is over-etched to expose the insulating layer spacer 17 and contact plug 10 for the storage electrode.

Figure 2C:
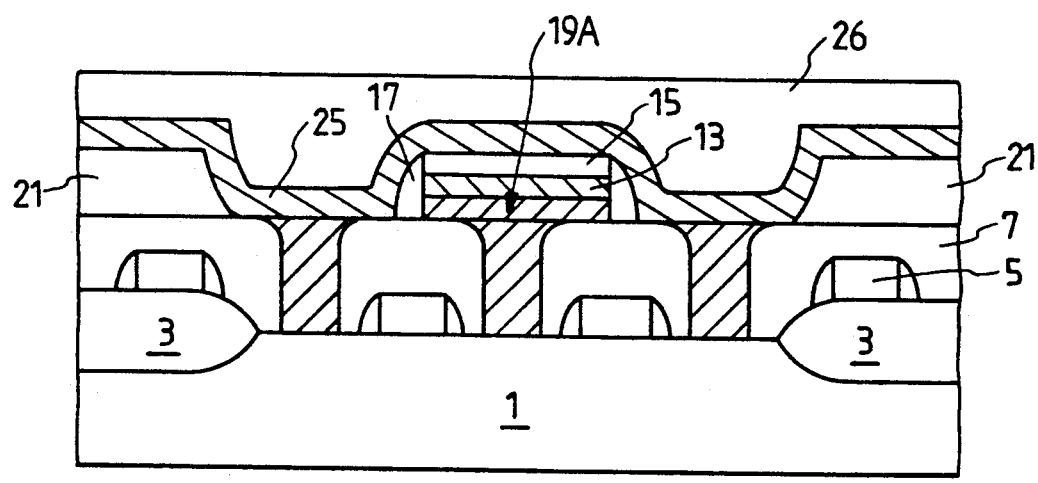

The insulating layer spacer 17 and the first insulating layer 7 which are oxide layers act as etching barriers during the etching process to the third insulating layer 21 which is the BPSG layer mentioned earlier. After removing the photoresist layer pattern 23 for storage electrode contact mask, a conducting layer 25 for storage electrode (polysilicon, for example) is deposited over the entire substrate and then, a photoresist layer 26 is coated over it as shown in FIG. 2c.

Figure 2D:
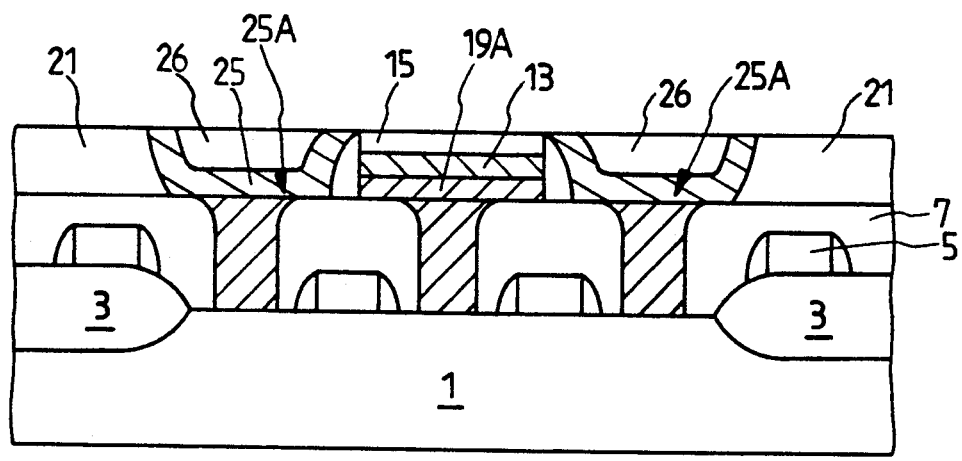

FIG. 2d is a cross-sectional view illustrating the step of forming a storage electrode pattern 25A by etching said photoresist layer 26 and conducting layer 25 for storage electrode with identical etching ratios until the third insulating layer 21 and the second insulating layer 15 are completely exposed. It illustrates the fact that the storage electrode 25A has the same height as the second insulating layer 15.

Figure 2E:
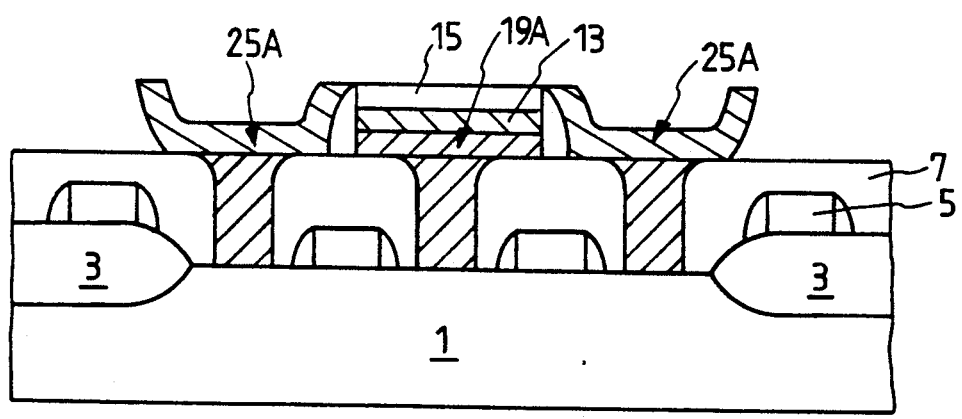

FIG. 2e is a cross-sectional view illustrating the steps of removing the remaining photoresist layer 26 and exposing the top and side parts of storage electrode by wet etching the third insulating layer 21. The first insulating layer 7 made of oxide layer acts as an etching barrier when etching the third insulating layer 21 which is formed with BPSG.

After completing the processes described in FIG. 2e, a dielectric layer (not illustrated) of the capacitor and a conducting layer for plate electrode (not illustrated) may be deposited on the lower part of storage electrode, thus completing the capacitor manufacturing process.

As described so far, the manufacturing method of the present invention eliminates the processes of forming and removing the photoresist for storage electrode mask that are required by the conventional method. Also, the storage electrode is formed as high as the bit line, thus greatly lowering the topology of the capacitor. Furthermore, the contact plugs are formed in the contact holes fox the storage electrode and bit line at the same time, in order to facilitate the contacting process of the storage electrode which will be carried out later.

What is claimed is:

1. A method of manufacturing a DRAM cell comprising the steps of:
    forming a word line having an oxide layer spacer on its side wall, on a silicon substrate;
    forming a first insulating layer on the entire silicon substrate;
    forming several contact holes by etching out some portions of the first insulating layer using contact masks for bit line and storage electrode;
    forming a contact plug by filling the contact holes with a conductive material;
    depositing a conducting layer fox bit line and a second insulating layer on the substrate including said first insulating layer and contact plug, and forming a second insulating layer pattern and bit line pattern on the contact plug for bit line by the etching process using a bit line mask;
    forming an insulating layer spaces on the side walls of the bit line pattern and the second insulating layer pattern;
    forming a third insulating layer over the entire substrate, and etching back until the underlying second insulating layer is exposed;
    forming a photoresist layer pattern for storage electrode contact mask on the third insulating layer;
    isotropically etching the third insulating layer that has been exposed to the contact plug for storage electrode, and removing the photoresist layer pattern for storage electrode contact mask;
    depositing a conducting layer for storage electrode over the entire substrate, and coating a photoresist layer over it;
    forming a storage electrode pattern by etching back the photoresist layer and conducting layer for storage electrode until the third insulating layer and the second insulating layer are exposed;
    removing the remaining photoresist layer, and wet etching out third insulating layer to expose the storage electrode; and
    forming a capacitor dielectric layer and plate electrode on top of the storage electrode.

2. The method according to claim 1 wherein said third insulating layer has an etching ratio that is different from that of the first and second insulating layers, and the insulating layer spacer.

3. The method according to claim 2 wherein said third insulating layer is BPSG layer.

4. The method according to claim 2 wherein said first and second insulating layers, and said insulating layer spacer are oxide layer.

5. The method according to claim 1 wherein said formation of a contact plug comprises the steps of formation of a conducting layer over the entire substrate and etching back to leave the conducting layer only on the contact holes.

6. The method according to claim 1 wherein said formation of a contact plug comprises the step of selectively depositing a polysilicon layer or metal layer only onto the contact holes.

7. The method according to claim 1 further comprising the step of forming a silicide layer on the conducting layer for bit line.

8. The method according to claim 1 wherein said photoresist layer and conducting layer for storage electrode are etched back with identical etching ratios.

* * * * *

UNITED STATES PATENT AND TRADEMARK OFFICE
CERTIFICATE OF CORRECTION

PATENT NO. : 5,332,685

DATED : July 26, 1994

INVENTOR(S) : Park et al.

It is certified that error appears in the above-identified patent and that said Letters Patent is hereby corrected as shown below:

```
Col. 1, line 32  "fox" should read --for--

Col. 2, line 10  "fox" should read --for--

Col. 2, line 13  "fox" should read --for--

Col. 2, line 32  "photo resistor" should read --photoresist--

Col. 2, line 33  "photo resistor" should read --photoresist--

Col. 3, line 68  "fox" should read --for--

Col. 4, line 15  "fox" should read --for--

Col. 4, line 21  "spaces" should read --spacer--
```

Signed and Sealed this

Seventeenth Day of December, 1996

*Attest:*

BRUCE LEHMAN

*Attesting Officer*  *Commissioner of Patents and Trademarks*